(12) United States Patent
Zhao

(10) Patent No.: US 11,222,927 B2
(45) Date of Patent: Jan. 11, 2022

(54) FOLDABLE OLED DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Jinrong Zhao, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 456 days.

(21) Appl. No.: 16/473,179

(22) PCT Filed: Apr. 11, 2019

(86) PCT No.: PCT/CN2019/082274
§ 371 (c)(1),
(2) Date: Jun. 24, 2019

(87) PCT Pub. No.: WO2020/124886
PCT Pub. Date: Jun. 25, 2020

(65) Prior Publication Data
US 2021/0343800 A1    Nov. 4, 2021

(30) Foreign Application Priority Data
Dec. 20, 2018   (CN) .......................... 201811561838.2

(51) Int. Cl.
*H01L 27/32* (2006.01)
*H01L 51/00* (2006.01)

(52) U.S. Cl.
CPC ...... *H01L 27/3218* (2013.01); *H01L 51/0097* (2013.01); *H01L 2251/5338* (2013.01)

(58) Field of Classification Search
None
See application file for complete search history.

(56) References Cited

U.S. PATENT DOCUMENTS

| 9,991,456 B2 | 6/2018 | Senda et al. |
| 2018/0329243 A1 | 11/2018 | Chien |
| 2019/0250662 A1* | 8/2019 | Jang ...................... G06F 1/1616 |

FOREIGN PATENT DOCUMENTS

| CN | 106909009 A |   | 6/2017 |
| CN | 107219700 A |   | 9/2017 |
| CN | 107564923 A |   | 1/2018 |
| CN | 107706219 A |   | 2/2018 |
| CN | 108803154 A | * | 11/2018 |
| CN | 108803154 A |   | 11/2018 |

* cited by examiner

Primary Examiner — J. E. Schoenholtz

(57) ABSTRACT

A foldable organic light emitting diode (OLED) display panel includes a bending region and a non-bending region, and includes a plurality of subpixels, formed in the bending region and the non-bending region, a part of or all of the plurality of subpixels having a self-illumination property; and first spacers, configured to provide support and form gaps, wherein the first spacers are disposed in the bending region and distributed in a shape of net, and surrounds the plurality of subpixels. The display panel can enhance an ability of the subpixels in the bending region to endure stress throughout a bending process and ensure reliability of the display panel.

16 Claims, 4 Drawing Sheets

FOLDABLE OLED DISPLAY PANEL

FIELD OF THE DISCLOSURE

The present application relates to display technologies, and more particularly, to a foldable organic light emitting diode (OLED) display panel.

DESCRIPTION OF RELATED ARTS

Flexible display screens have broad prospects of applications since they can be bended, folded, and stretched arbitrarily and have advantages of thin and light, compact properties, low power consumption, and high portability. For display technologies, whether foldable or stretchable, or arbitrarily bendable, it is a technological innovation for flexible display technologies.

In current dynamic foldable display products, axes for the bending are fixed. As shown in FIG. 1A, a bending axis A1 of a display product with two folds is located in a middle area of a screen of the display product. As shown in FIG. 1B, bending axes B1 and B2 of a display product with three folds are located at ⅓ and ⅔ of a screen of the display product, respectively. A bending radius is about 5 mm or 3 mm.

FIG. 2 is a schematic diagram showing an existing foldable OLED display panel. As shown in FIG. 2, the existing foldable OLED display panel includes red subpixels 101, blue subpixels 102, and green subpixels 103. There are spacers 110 distributed between the subpixels 101, 102, and 103. The spacers 110 are used to provide support for film layers and form gaps between the film layers.

In the existing foldable OLED display panel, thin-film transistor (TFT) structure and film layer structure in a bending region of a display area or an active area (AA) are substantially the same as that in a non-bending region of the display area or the active area. All of the spacers 110 in the bending region and the non-bending region of the display area are small squares and are evenly distributed in the display area under the same density.

However, each film layer of the TFTs in the bending region sustains greater external pull and stress than that in the non-bending region in the process of folding the display panel. After the display panel is folded and refolded for many times, the stress accumulated in the subpixels within the bending region is not evenly distributed such that it is easy for display components in the bending region to be degraded, thereby affecting reliability of the display panel.

Technical Problems

An objective of the present application is to provide a foldable OLED display panel, for solving the problem of unevenly-distributed stress applied to subpixels in a bending region of an existing foldable OLED display panel.

Technical Solutions

To achieve above objective, an aspect of the present application provides a foldable OLED display panel, including a bending region and a non-bending region, the bending region forming a curved surface when the display panel is folded and the bending region and the non-bending region forming a flat surface when the display panel is not folded, the display panel including:

a plurality of subpixels, formed in the bending region and the non-bending region, a part of or all of the plurality of subpixels having a self-illumination property; and first spacers, configured to provide support and form gaps, wherein the first spacers are disposed in the bending region and distributed in a shape of net, and surrounds the plurality of subpixels.

In an embodiment of the present application, the first spacers encompass each of the plurality of subpixels in the bending region.

In an embodiment of the present application, the plurality of subpixels include red subpixels, blue subpixels, and green subpixels, and the first spacers are disposed between the red subpixels and the blue subpixels, between the red subpixels and the green subpixels, and between the blue subpixels and the green subpixels.

In an embodiment of the present application, the first spacers are distributed in the shape of net consisting of line segments.

In an embodiment of the present application, the first spacers are distributed in the shape of net consisting of winding segments.

In an embodiment of the present application, the display panel further includes:

a plurality of second spacers, configured to provide support and form gaps, wherein the plurality of second spacers are disposed in the non-bending region and each of the plurality of second spacers corresponds to a predetermined number of the subpixels.

In an embodiment of the present application, the first spacers and the second spacers are of a same material.

In an embodiment of the present application, the first spacers include light sensitive spacers.

In an embodiment of the present application, a material of the first spacers is an organic photoresist.

In another aspect, the present application provides a foldable OLED display panel, including a bending region and a non-bending region, the bending region forming a curved surface when the display panel is folded and the bending region and the non-bending region forming a flat surface when the display panel is not folded, the display panel including:

a plurality of subpixels, formed in the bending region and the non-bending region, a part of or all of the plurality of subpixels having a self-illumination property;

first spacers, configured to provide support and form gaps, the first spacers disposed in the bending region; and a plurality of second spacers, configured to provide support and form gaps, the second spacers disposed in the non-bending region.

wherein each of the plurality of second spacers corresponds to a predetermined number of the subpixels, and the first spacers are distributed in a shape of net and surrounds each of the subpixels in the bending region.

In an embodiment of the present application, the plurality of subpixels include red subpixels, blue subpixels, and green subpixels, and the first spacers are disposed between the red subpixels and the blue subpixels, between the red subpixels and the green subpixels, and between the blue subpixels and the green subpixels.

In an embodiment of the present application, the first spacers are distributed in the shape of net consisting of line segments.

In an embodiment of the present application, the first spacers are distributed in the shape of net consisting of winding segments.

In an embodiment of the present application, the first spacers and the second spacers are of a same material.

In an embodiment of the present application, the first spacers include light sensitive spacers.

In an embodiment of the present application, a material of the first spacers is an organic photoresist.

BENEFICIAL EFFECTS

In the foldable OLED display panel of the present application, the display panel is divided into the non-bending region and the bending region, and the spacers in the bending region are distributed in the shape of net and surround the subpixels (e.g., the red, blue, and green subpixels). By using the web-like spacers, the encapsulated subpixels can be protected and the problem of unevenly-distributed stress applied to the subpixels can be effectively avoided. An ability of the subpixels in the bending region to endure stress throughout a bending process is enhanced and reliability of the display panel is ensured.

DESCRIPTION OF EMBODIMENTS OF THE DISCLOSURE

To make the objectives, technical schemes, and effects of the present application more clear and specific, the present application is described in further detail below with reference to the embodiments in accompanying with the appending drawings. It should be understood that the specific embodiments described herein are merely for explaining the present application, the term "embodiment" used in the context means an example, instance, or illustration, and the present application is not limited thereto.

Figure 1A:
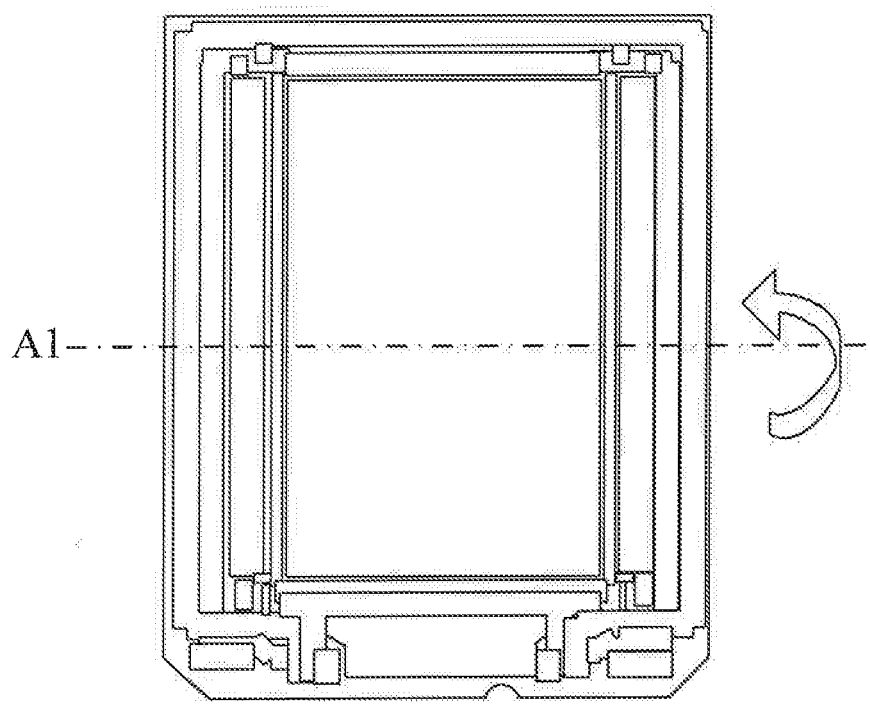
FIG. 1A is a schematic diagram showing an existing display product with two folds.
Figure 1B:
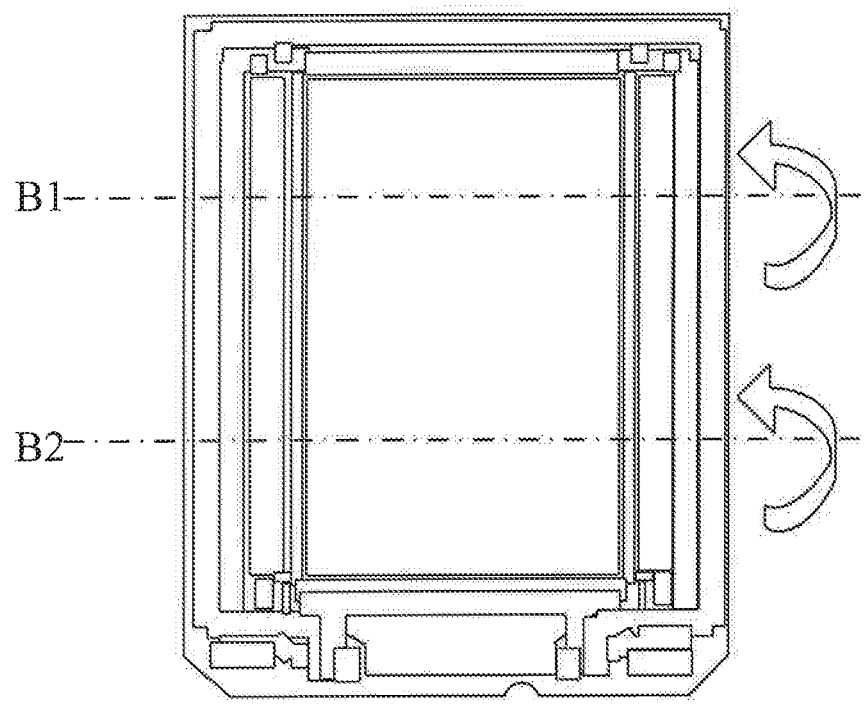
FIG. 1B is a schematic diagram showing an existing display product with three folds.
Figure 2:
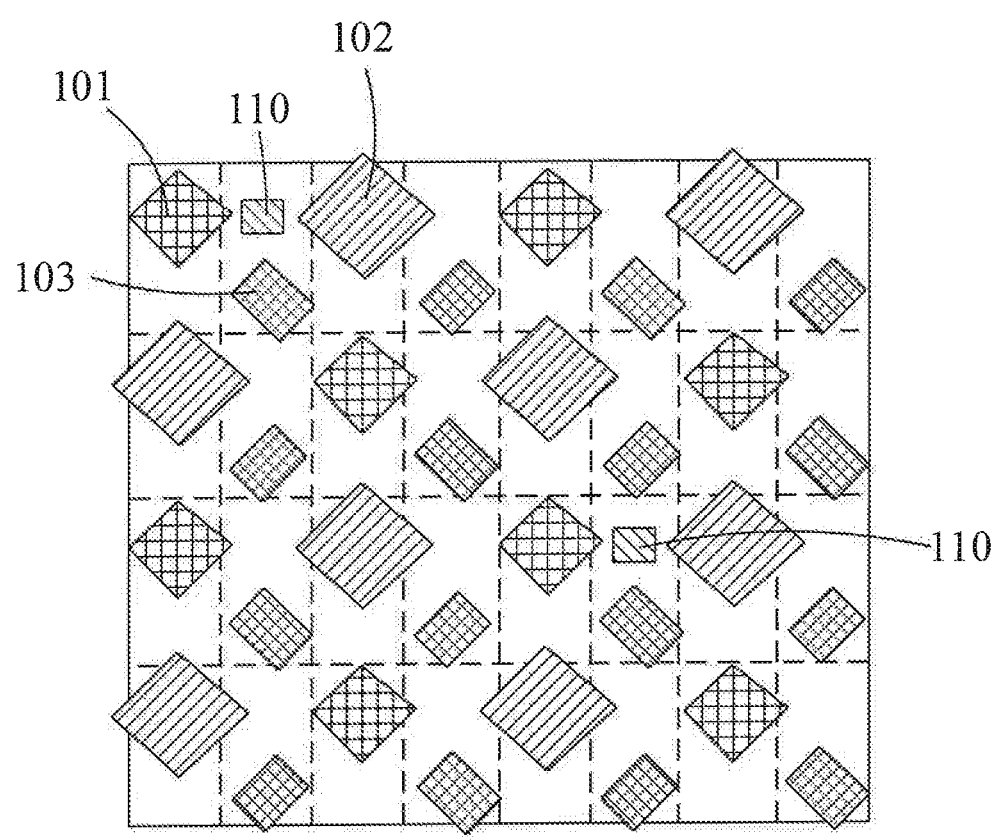
FIG. 2 is a schematic diagram showing an existing foldable OLED display panel.
Figure 3:
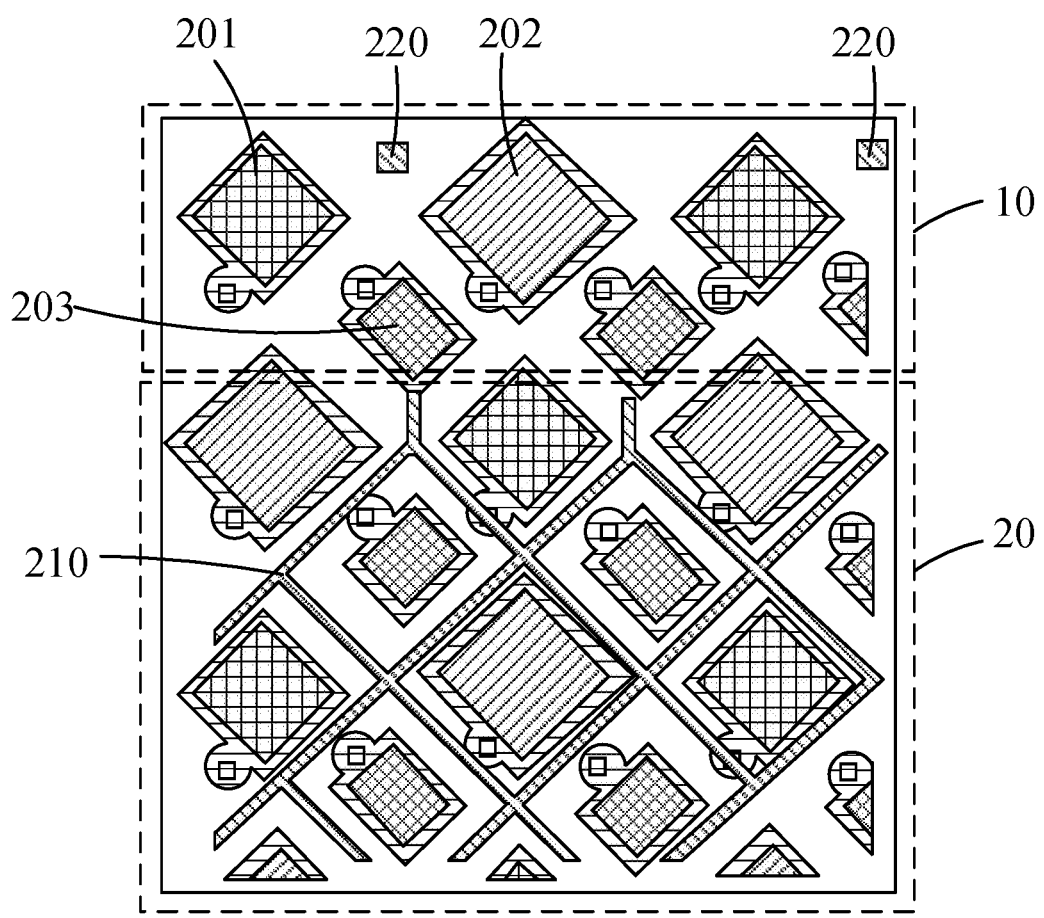
FIG. 3 is a schematic diagram showing a foldable OLED display panel according to a first embodiment of the present application.

FIG. 3 is a schematic diagram showing a foldable organic light emitting diode (OLED) display panel according to a first embodiment of the present application. As shown in FIG. 3, the foldable OLED display panel includes a non-bending region 10 and a bending region 20. The display panel is foldable along the bending 20. The bending region 20 forms a curved surface when the display panel is folded. The bending region 20 and the non-bending region 10 form a flat surface when the display panel is not folded. The display panel can be implemented by a display panel with two or three folds, or by other types of foldable OLED display panel.

The display panel includes a plurality of subpixels, for example, red subpixels 201, blue subpixels 202, and green subpixels 203 as shown in FIG. 3. The adjacent subpixels 201, 202, and 203 are disposed away from each other for predetermined distances. The subpixels corresponding to each color are evenly distributed on the display panel. All of the subpixels 201, 202, and 203 are formed in the bending region 20 and the non-bending region 10. A part of or all of subpixels 201, 202, and 203 have a self-illumination property. For example, each of the subpixels 201, 202, and 203 corresponds to an OLED illuminating device. For example, a subpixel of a particular color corresponds to an OLED illuminating device and light from subpixels corresponding to other colors is generated by exciting the OLED illuminating device.

The display panel includes first spacers 210 disposed in the bending region 20. The first spacers 210 are configured to provide support and form gaps. Specifically, the first spacers 210 are configured to provide support for film layers to make the gaps be formed between the film layers. For example, the first spacers 210 may be disposed between a thin film transistor (TFT) array substrate and a color filter (CF) substrate for forming gaps between the TFT array substrate and the CF substrate. For example, the first spacers 210 may be disposed between an OLED substrate and a thin film encapsulating (TFE) structure that is used to avoid invasion of moisture and oxygen, for forming gaps between the OLED substrate and the thin film encapsulating structure.

The first spacers 210 may include light sensitive spacers. The material of the first spacers 210 is an organic photoresist. For example, the first spacers 210 may be manufactured adopting organic photoresist such as DL-1000 and DL-1001C, and may be manufactured using common photolithography or half-tone processes.

As shown in FIG. 3, the first spacers 210 disposed in the bending region 20 are distributed in a shape of net, and surrounds the subpixels 201, 202, and 203. Specifically, as shown in FIG. 3, the first spacers 210 are distributed in the shape of net consisting of line segments. In an embodiment, the first spacers 210 encompass each of the subpixels in the bending region 20. Specifically, the first spacers 210 are disposed between the red subpixels 201 and the blue subpixels 202, between the red subpixels 201 and the green subpixels 203, and between the blue subpixels 202 and the green subpixels 203.

The subpixels of the bending region 20 are surrounded by the first spacers 210. The first spacers 210 are evenly distributed. The thickness and the pattern of the first spacers 210 are uniform. Accordingly, external or internal stress can be dispersed in a better way in folding the display panel, and the stress is avoided to be concentrated on a certain subpixel to cause the subpixel to be invalid.

The display panel may further include a plurality of second spacers 220 disposed in the non-bending region 10. Each of the plurality of second spacers 220 corresponds to a predetermined number of subpixels. For example, each of the second spacers 220 is a small square (of a size of 12×12 um). One second spacer 220 is distributed among every eight subpixels, and the density in this distribution is 0.35%. The plurality of second spacers 220 are configured to provide support and form gaps. Specifically, the plurality of second spacers 220 are configured to provide support for film layers to make the gaps be formed between the film layers. The second spacers 220 and the first spacers 210 may be manufactured using a same material under a same process. For example, both of the second spacers 220 and the first spacers 210 are organic photoresist, and are manufactured using a common photolithography or half-tone technology under a same process. Modifying an existing mask is only needed without a need to add an additional mask in manufacturing the second spacers 220 and the first spacers 210 at the same time.

Figure 4:
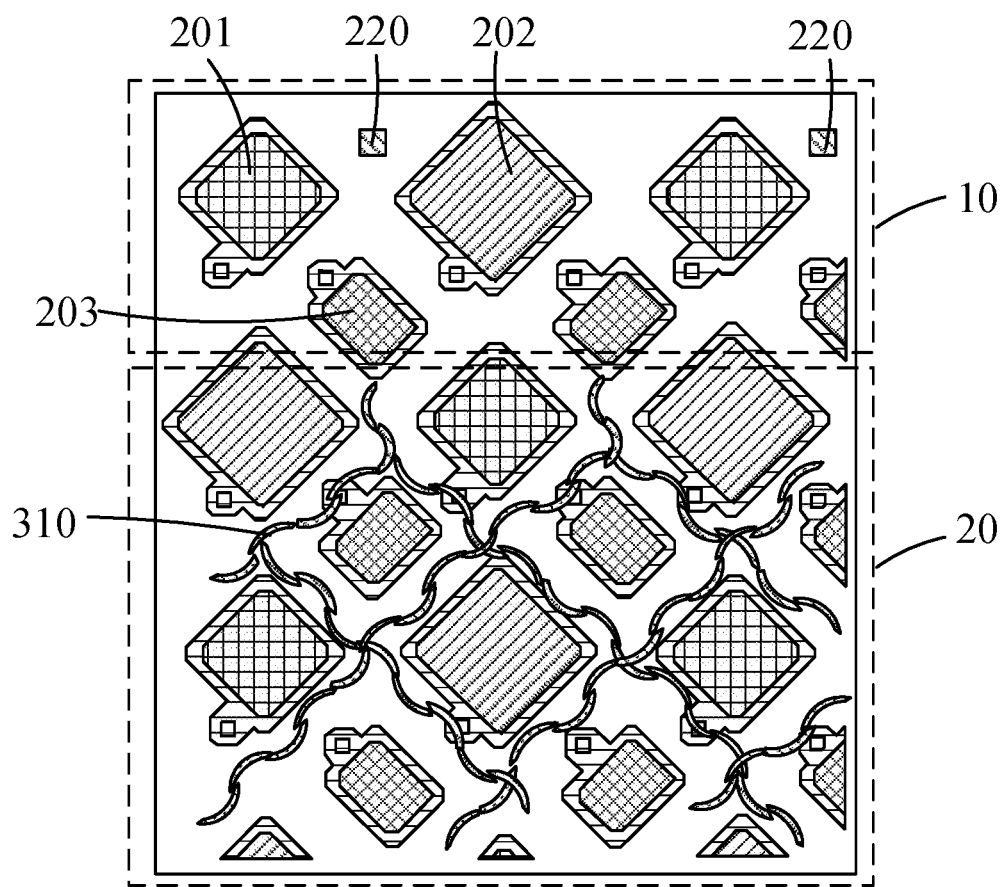
FIG. 4 is a schematic diagram showing a foldable OLED display panel according to a second embodiment of the present application.

FIG. 4 is a schematic diagram showing a foldable OLED display panel according to a second embodiment of the present application. The difference between the first embodiment and the second embodiment of the present application is that in the second embodiment of the present application, the display panel includes first spacers 310 that are distributed in a shape of net consisting of winding segments. Compared to the first embodiment, the first spacers 310 of the second embodiment of the present application distributed in the shape of net consisting of winding segments can buffer and release the stress in a better way.

In the foldable OLED display panels of the first embodiment and the second embodiment of the present application, the display panel is divided into the non-bending region and the bending region, and the spacers in the bending region are distributed in the shape of net and surround the subpixels (e.g., the red, blue, and green subpixels). By using the web-like spacers, the encapsulated subpixels can be protected and the problem of unevenly-distributed stress applied to the subpixels can be effectively avoided. An ability of the subpixels in the bending region to endure stress throughout a bending process is enhanced and reliability of the display panel is ensured.

Above all, while the preferred embodiments of the present application have been illustrated and described in detail, it is intended that the present application should not be limited to the preferred embodiment. Various modifications and alterations which maintain the realm of the present application can be made by persons skilled in this art. The protective scope of the present application is subject to the scope as defined in the claims.

The invention claimed is:

1. A foldable organic light emitting diode (OLED) display panel, comprising a bending region and a non-bending region, the bending region forming a curved surface when the display panel is folded and the bending region and the non-bending region forming a flat surface when the display panel is not folded, the display panel comprising:
   a plurality of subpixels, formed in the bending region and the non-bending region, a part of or all of the plurality of subpixels having a self-illumination property; and
   first spacers, configured to provide support and form gaps, wherein the first spacers are disposed in the bending region and distributed in a shape of net, and surrounds the plurality of subpixels.

2. The display panel according to claim 1, wherein the first spacers encompass each of the plurality of subpixels in the bending region.

3. The display panel according to claim 1, wherein the plurality of subpixels comprise red subpixels, blue subpixels, and green subpixels, and the first spacers are disposed between the red subpixels and the blue subpixels, between the red subpixels and the green subpixels, and between the blue subpixels and the green subpixels.

4. The display panel according to claim 1, wherein the first spacers are distributed in the shape of net consisting of line segments.

5. The display panel according to claim 1, wherein the first spacers are distributed in the shape of net consisting of winding segments.

6. The display panel according to claim 1, further comprising:
   a plurality of second spacers, configured to provide support and form gaps, wherein the plurality of second spacers are disposed in the non-bending region and each of the plurality of second spacers corresponds to a predetermined number of the subpixels.

7. The display panel according to claim 6, wherein the first spacers and the second spacers are of a same material.

8. The display panel according to claim 1, wherein the first spacers comprise light sensitive spacers.

9. The display panel according to claim 8, wherein a material of the first spacers is an organic photoresist.

10. A foldable organic light emitting diode (OLED) display panel, comprising a bending region and a non-bending region, the bending region forming a curved surface when the display panel is folded and the bending region and the non-bending region forming a flat surface when the display panel is not folded, the display panel comprising:
    a plurality of subpixels, formed in the bending region and the non-bending region, a part of or all of the plurality of subpixels having a self-illumination property;
    first spacers, configured to provide support and form gaps, the first spacers disposed in the bending region; and
    a plurality of second spacers, configured to provide support and form gaps, the second spacers disposed in the non-bending region,
    wherein each of the plurality of second spacers corresponds to a predetermined number of the subpixels, and the first spacers are distributed in a shape of net and surrounds each of the subpixels in the bending region.

11. The display panel according to claim 10, wherein the plurality of subpixels comprise red subpixels, blue subpixels, and green subpixels, and the first spacers are disposed between the red subpixels and the blue subpixels, between the red subpixels and the green subpixels, and between the blue subpixels and the green subpixels.

12. The display panel according to claim 10, wherein the first spacers are distributed in the shape of net consisting of line segments.

13. The display panel according to claim 10, wherein the first spacers are distributed in the shape of net consisting of winding segments.

14. The display panel according to claim 10, wherein the first spacers and the second spacers are of a same material.

15. The display panel according to claim 10, wherein the first spacers comprise light sensitive spacers.

16. The display panel according to claim 15, wherein a material of the first spacers is an organic photoresist.

* * * * *